US005533540A

United States Patent [19]
Stanasolovich et al.

[11] Patent Number: 5,533,540
[45] Date of Patent: Jul. 9, 1996

[54] APPARATUS FOR UNIFORM CLEANING OF WAFERS USING MEGASONIC ENERGY

[75] Inventors: David Stanasolovich, Montgomery, N.Y.; William A. Syverson, Colchester, Vt.; Ronald A. Warren, Troy, N.Y.

[73] Assignee: Inernational Business Machines Corporation, Armonk, N.Y.

[21] Appl. No.: 370,714

[22] Filed: Jan. 10, 1995

Related U.S. Application Data

[62] Division of Ser. No. 276,684, Jul. 18, 1994, Pat. No. 5,427,622, which is a continuation of Ser. No. 20,037, Feb. 12, 1993, abandoned.

[51] Int. Cl.⁶ .................................................. B08B 3/10
[52] U.S. Cl. ......................... 134/155; 134/184; 134/186; 134/902; 68/3 SS
[58] Field of Search .................. 134/184, 155, 134/902, 186; 366/127; 68/3 SS

[56] References Cited

U.S. PATENT DOCUMENTS

| 2,366,822 | 1/1945 | Willard ................................ 68/3 SS |
| 2,650,872 | 9/1953 | Goldwasser ...................... 68/3 SS X |
| 3,035,491 | 5/1962 | Rosenthal et al. ................. 366/127 X |
| 3,419,426 | 12/1968 | Wood ................................... 68/3 SS |
| 3,744,302 | 7/1973 | O'Meara, Jr. . |
| 3,893,869 | 7/1975 | Mayer et al. .......................... 134/184 |
| 5,038,808 | 8/1991 | Hammond et al. . |
| 5,127,424 | 7/1997 | Stein et al. ......................... 134/155 X |

FOREIGN PATENT DOCUMENTS

| 745562 | 7/1980 | U.S.S.R. ................................ 134/184 |
| 1152672 | 4/1985 | U.S.S.R. ................................ 134/184 |

*Primary Examiner*—Frankie L. Stinson
*Attorney, Agent, or Firm*—Heslin & Rothenberg

[57] ABSTRACT

Apparatus and method for cleaning/etching the surface of an article with sonic energy in the megahertz range which employ an anti-reflection mechanism within a recirculation tank. A tank having at least one side wall and a bottom structure holds a cleaning/etching liquid and a megasonic transducer is associated with the tank for projecting megasonic energy into the liquid. The anti-reflection mechanism is disposed within the tank in close association with the at least one sidewall or bottom structure of the tank to thereby minimize reflection of megasonic energy from the associated surface. Preferably, the megasonic transducer is associated with a first tank sidewall which opposes a second tank sidewall, and the anti-reflection mechanism is disposed adjacent the second tank sidewall. By way of example, the anti-reflection mechanism can comprise a stream of gas bubbles, a plurality of anechoic structures, or a combination of both gas bubbles and anechoic structures.

14 Claims, 2 Drawing Sheets

APPARATUS FOR UNIFORM CLEANING OF WAFERS USING MEGASONIC ENERGY

This application is a division of application Ser. No. 08/276,684, filed Jul. 18, 1994, now U.S. Pat. No. 5,427,622 which was a continuation of application Ser. No. 08/020,037, filed Feb. 12, 1993, now abandoned.

TECHNICAL FIELD

This invention relates in general to sonic cleaning of a surface of an article such as a semiconductor substrate or semiconductor wafer, and in particular, to apparatus and method for enhanced cleaning of the surface of an article disposed within a recirculation tank using sonic energy in the megahertz range. The technique employs an anti-reflection mechanism proximate to an inner surface of the recirculation tank to inhibit the creation of standing waves within the cleaning liquid.

BACKGROUND ART

The removal of minute contaminants from a surface of a substrate or wafer continues to be an important operation in the manufacture of semiconductor devices, photomasks, and the like. Most minute contaminants tenaciously hold to a surface and require a relatively large force to remove them. The use of ultrasonic energy to enhance the cleaning action of solutions used on semiconductor substrates and wafers is now well established (see, e.g., U.S. Pat. No. 4,854,337). Ultrasonic agitation has also been used to enhance the action of etching solutions on semiconductor substrates and wafers. Such cleaning and etching processes conventionally use transducers operating at intermediate frequencies, i.e., 20–50 KHz., and, more recently, high frequencies of 0.2 to 5.0 MHz. The use of high frequency, or megasonic, agitation of solutions has resulted in improved cleaning and etching, particularly on substrates and wafers with very small, micron size components or elements disposed thereon. Further, use of high frequency agitation provides a gentler cleaning action on the wafers and substrates than that obtainable with an intermediate frequency agitation. As a result, damage to micro sized components during cleaning/etching operations is significantly reduced.

In a conventional implementation, one or more megasonic transducers are mounted in association with a bottom surface of the cleaning tank. Such structures have the inherent drawback that transducer placement interferes with laminar flow of the chemical within the recirculation tank. This results in stagnant zones within the tank with no flow of chemical. Such zones are undesirable because they tend to be highly contaminated with particulates which can redeposit on the wafers as the wafers are being drawn through these areas, either on immersion into or withdrawal from the recirculation tank. High particulate content within stagnant zones can also contaminate fresh chemical if the flow patterns are disturbed upon wafer immersion.

Various attempts have been made to provide mechanical agitation to tank type cleaning and etching baths employing megasonic frequency generating transducers. As described in U.S. Pat. No. 4,854,337, such arrangements typically comprise apparatus to move the substrate/wafer containing cassettes through an energy beam created by the transducers, thereby ensuring that all portions of the wafer surfaces are treated by the energy beam. Unfortunately, creating the necessary agitation can be quite expensive and typically results in a much larger apparatus than otherwise necessary.

Thus, an improved technique wherein megasonic cleaning/etching of devices occurs within a laminar flow tank is needed and will achieve widespread acceptance in the semiconductor manufacturing industry.

DISCLOSURE OF INVENTION

Briefly summarized, this invention comprises in one aspect a sonic cleaning/etching apparatus which includes a recirculation tank having at least one sidewall and a bottom structure. The tank holds a cleaning/etching liquid within which the surface of an article, such as a semiconductor wafer, is cleaned/etched. A sonic transducer is associated with the tank for projecting sonic energy into the cleaning liquid and an anti-reflection mechanism is disposed within the tank in close association with either the at least one sidewall or the bottom structure. The anti-reflection mechanism is constructed such that the reflection of sonic energy off the associated sidewall or bottom structure is minimized, thereby inhibiting the creation of standing waves within the cleaning liquid held within the recirculation tank.

In enhanced embodiments, the sonic transducer(s) projects energy in the megasonics range. Further, the recirculation tank may have opposing first and second sidewalls, with the megasonic transducer(s) being associated with the first sidewall for projecting megasonic energy into the cleaning liquid towards the second sidewall. In such an embodiment, the anti-reflection mechanism is disposed adjacent the second sidewall for minimizing reflection of megasonic energy from the second sidewall. By way of example, the anti-reflection mechanism may comprise a stream of gas bubbles or a plurality of fixed anechoic structures disposed in association with the second sidewall. As a detailed example, the anechoic structures could be cone-shaped and the anti-reflection mechanism could include a mechanism for establishing trapped gas bubbles among the anechoic structures.

In another aspect, the present invention comprises a method for sonically cleaning/etching a surface of a semiconductor wafer. The method includes the steps of: providing a recirculation tank having opposing first and second sidewalls; at least partially filling the tank with a chemical cleaning/etching liquid selected to clean/etch the surface of semiconductor wafer; projecting megasonic energy into the cleaning liquid from the first sidewall towards the second sidewall; and absorbing sonic energy at the second sidewall to inhibit the creation of standing waves within the cleaning liquid.

By interrupting the reflection of megasonic energy from one or more inner surfaces of the recirculation tank, the creation of standing waves within the cleaning liquid is inhibited. Thus, a laminar flow can be established within the tank with the overall effect that contamination within the recirculation tank is decreased. Further, a more uniform energy distribution throughout the tank is established, thereby providing enhanced cleaning/etching of the semiconductor wafers. Additionally, by eliminating reflected waves the life span of the recirculation tank is improved, which inhibits formation of contaminants that would otherwise be introduced into the cleaning fluid by degradation of the tank.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which:

FIG. 4a is an elevational view of yet another embodiment of a megasonic cleaning/etching apparatus pursuant to the present invention;

FIG. 4b is an enlarged view of an anti-reflection mechanism employed by the megasonic cleaning/etching apparatus of FIG. 4a; and FIG. 4c is a plan view of a portion of the anti-reflection mechanism of FIG. 4b.

BEST MODE FOR CARRYING OUT THE INVENTION

Figure 1:
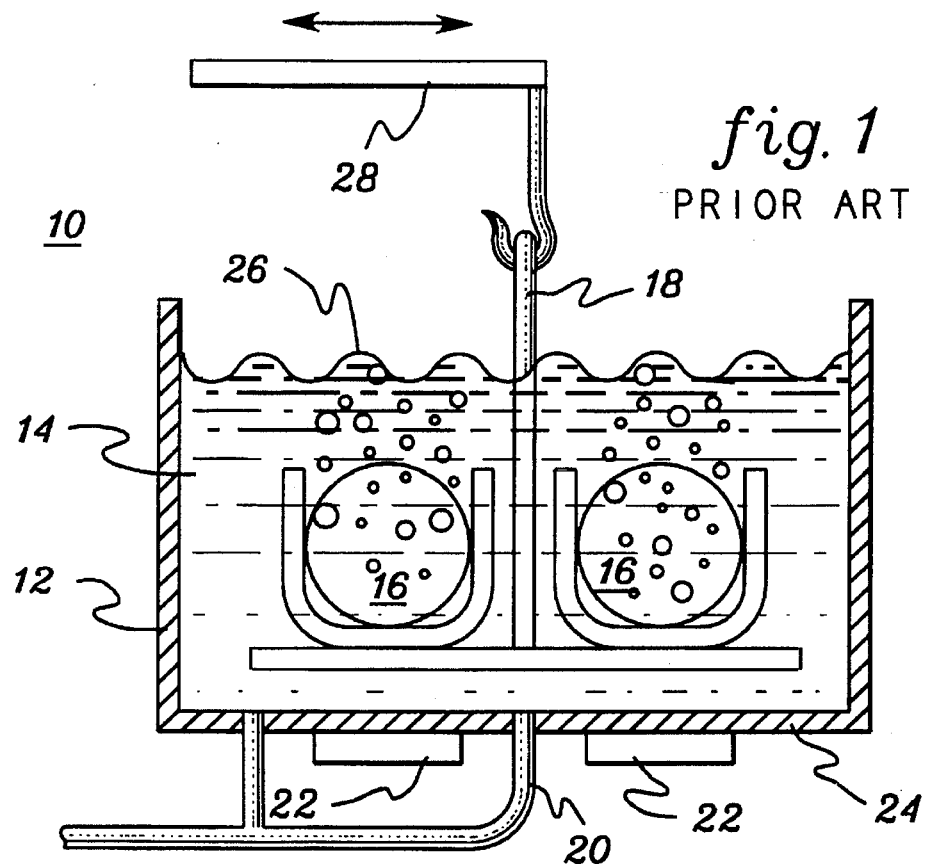
FIG. 1 is an elevational view of a conventional megasonic cleaning/etching apparatus.

Referring first to FIG. 1, a conventional megasonic cleaning/etching apparatus, generally denoted 10, is presented. Apparatus 10 includes a recirculation tank 12 which is adapted to hold a bath of cleaning liquid 14 known to accomplish a desired cleaning or etching of a plurality of semiconductor substrates or semiconductor wafers 16 (herein referred to as "wafers"). (Also, as used subsequently, the term "cleaning" should be read to include etching.) Wafers 16 are supported within the chemical bath by a specially designed holder 18. A chemical feed line 20 supplies cleaning liquid 14 to tank 12 and one or more megasonic transducers 22 are positioned along the bottom 24 of recirculation tank 12. The chemical cleaning liquid has an upper chemical surface 26 within the tank.

Traditionally, megasonic transducers 22 produce waves of an essentially single and constant frequency, which results in a substantially uniform pattern of standing waves being set up within the cleaning liquid. As the depth to the liquid in the tank varies, wave reflection from the upper surface of the liquid will change in intensity but the pattern of the standing waves in the liquid will remain substantially uniform, that is, all standing waves will have essentially the same vertical locations of peaks and nulls. As a result, the peaks and nulls of the wave patterns occur at certain levels in the liquid and remain at those levels during an entire cleaning cycle. The peak amplitudes of the standing waves remain essentially constant as long as the depth of the liquid is constant. This produces a non-uniform cleaning action along the height of a wafer disposed in the liquid.

Moreover, the uniformity of efficiency of the cleaning action changes as the liquid levels change because the intensity of energy reflected back into the bath varies as the liquid depth changes over the span of a quarter wavelength. Changes in liquid level also change the mechanical (and thus the overall) resonant frequency of the system and this results in significant variations in the output power of the sonic generator and input power to the transducer assembly even though no change takes place in the output voltage of the frequency generator.

The problems created by a standing wave pattern at an essentially single chosen frequency have long been recognized in the art of sonic cleaning. Various solutions have been proposed. By way of example, refer again to FIG. 1 wherein one solution has been to oscillate the wafer cassette 18 by connecting the holder to an oscillating arm 28. This approach is believed to be less than satisfactory, however, since the cleaning tank must be enlarged to accommodate movement of the wafer holder past the transducers, which in turn requires more space within the clean room than otherwise allocated for the process. Moreover, a larger tank volume requires a significantly larger volume of cleaning fluid to fill the tank and studies have shown that by moving the semiconductor wafers within the cleaning fluid, edge damage to the wafers can occur. Further, it has been found that due to the necessary high power operation of the resultant transducers, they must occasionally be replaced. Thus, in addition to having to regularly change the tank's solution, complete draining of the tank is sometimes necessary to effect replacement of a transducer.

Others have proposed the use of transducers mounted on the sidewalls of the megasonic cleaning tank (see, e.g., U.S. Pat. Nos. 3,893,869 and 5,088,510). Clearly, such sidewall mounted embodiments also result in the creation of unwanted standing waves within the cleaning liquid.

Another possible implementation is to arrange the transducers on the top of the chemical surface. This approach does not appear viable, however, for two reasons. First, bubbles that are resolved from the liquid chemical reacting with a wafer surface dampen sound waves both while rising to the surface and then again when they form air pockets beneath transducers positioned at the surface of the cleaning liquid. Complicated sweeping mechanisms may be used to remove such air pockets but their effectiveness is questionable.

Secondly, unlike the bottom mounted approach, sound waves are reflected from the bottom of the tank in a manner similar to a side mounted approach. This energy reflection results in standing waves and an uneven energy distribution throughout the tank. Because of this, there will be some areas where there is zero energy due to destructive interference of the waves. These areas will have no cleaning action. Further, the sound waves that hit the bottom of the tank are not perfectly reflected so that some of the energy of these waves is absorbed by the bottom of the tank thereby causing the tank structure to degrade with time and with the extent of applied power.

FIGS. 2–4c depict three possible embodiments of a megasonic cleaning/etching apparatus pursuant to the present invention. The unifying concept in all embodiments is the placement of an anti-reflection mechanism along an inner surface of the recirculation tank, a surface which otherwise would receive and reflect a significant portion of the megasonic energy projected into the tank.

Figure 2:
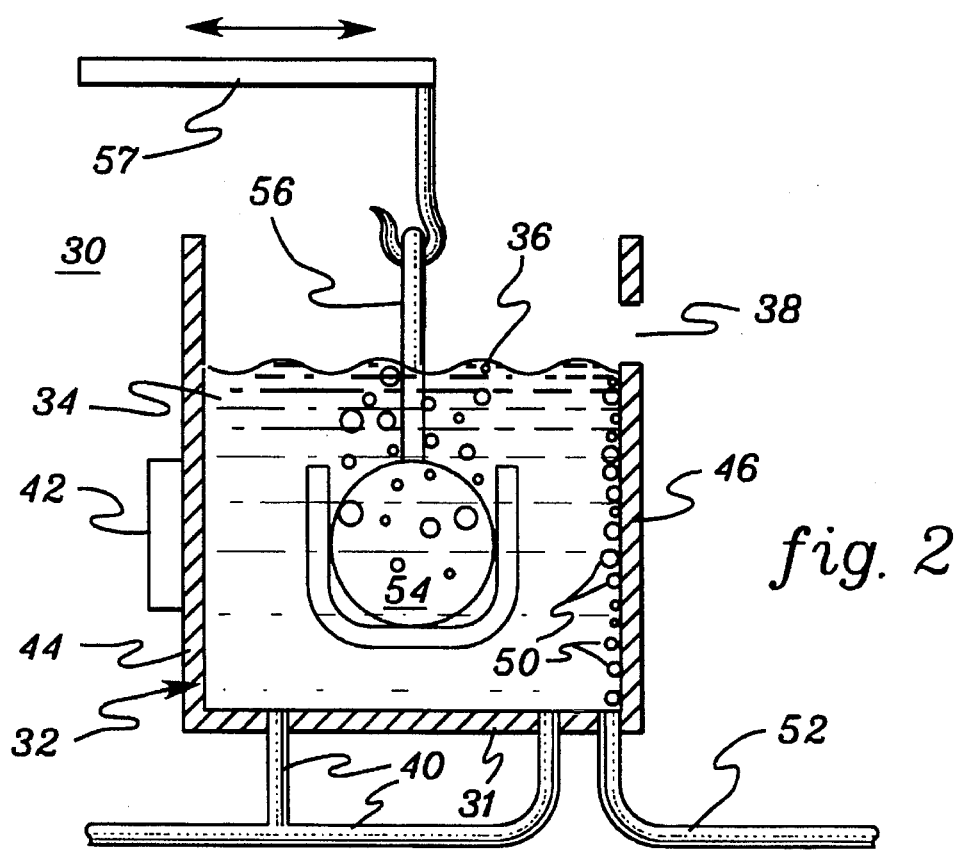
FIG. 2 is an elevational view of one embodiment of a megasonic cleaning/etching apparatus pursuant to the present invention.

FIG. 2 depicts a first embodiment of a megasonic cleaning/etching apparatus 30 pursuant to the present invention. Apparatus 30 includes a recirculation or cleaning tank 32, which contains a cleaning fluid 34 having an upper surface 36 substantially even with an overflow weir 38. The cleaning chemical is supplied to tank 12 via a chemical feed line 40 such that it is introduced through the bottom 31 of tank 32, and the entire bottom portion of the tank is preferably designed (by one skilled in the art) to produce a desired liquid flow pattern. One or more transducers 42 are positioned on a first sidewall 44 of tank 32 to project beams of megasonic energy into the cleaning liquid towards a second, opposing sidewall 46 of tank 32. Overflow weir 38 is located on second opposing sidewall 46 as shown.

In this embodiment, the invention addresses the problem of reflected waves from second opposing sidewall 46 by injecting a stream of small gas bubbles 50 into the liquid in close proximity to sidewall 46. Bubbles 50 are produced from an inert gas injection supply line 52 which can either include a line of nozzles along the bottom 31 of tank 32 and/or a pattern of nozzles along sidewall 46. The stream of bubbles 50 is continuous, with the small bubbles gradually rising to liquid surface 36 along sidewall 46. Bubbles 50 should be of sufficient number to absorb sound waves which would otherwise be reflected from the sidewall 46.

As an alternative embodiment, the bubbles could be established by a slightly active catalyst, e.g., disposed on the second sidewall, which would decompose over time as a result of reaction with the cleaning liquid. The catalyst used would depend upon the cleaning chemical employed as well as the sensitivity of the catalyst to different contaminants which the wafers might have at the particular cleaning/etching stage.

In either embodiment, the goal is to produce a stream of extremely fine bubbles which rise slowly within the cleaning liquid, absorbing incident sound energy along the way. Further, a plurality of wafers 54 disposed within a carrier 56 can be slightly oscillated back and forth past sidewall mounted transducer(s) 42 by connection of holder 56 to an oscillating arm 57. This would even out any nodes that would otherwise be formed by interference between multiple adjacent transducers.

Figure 3:
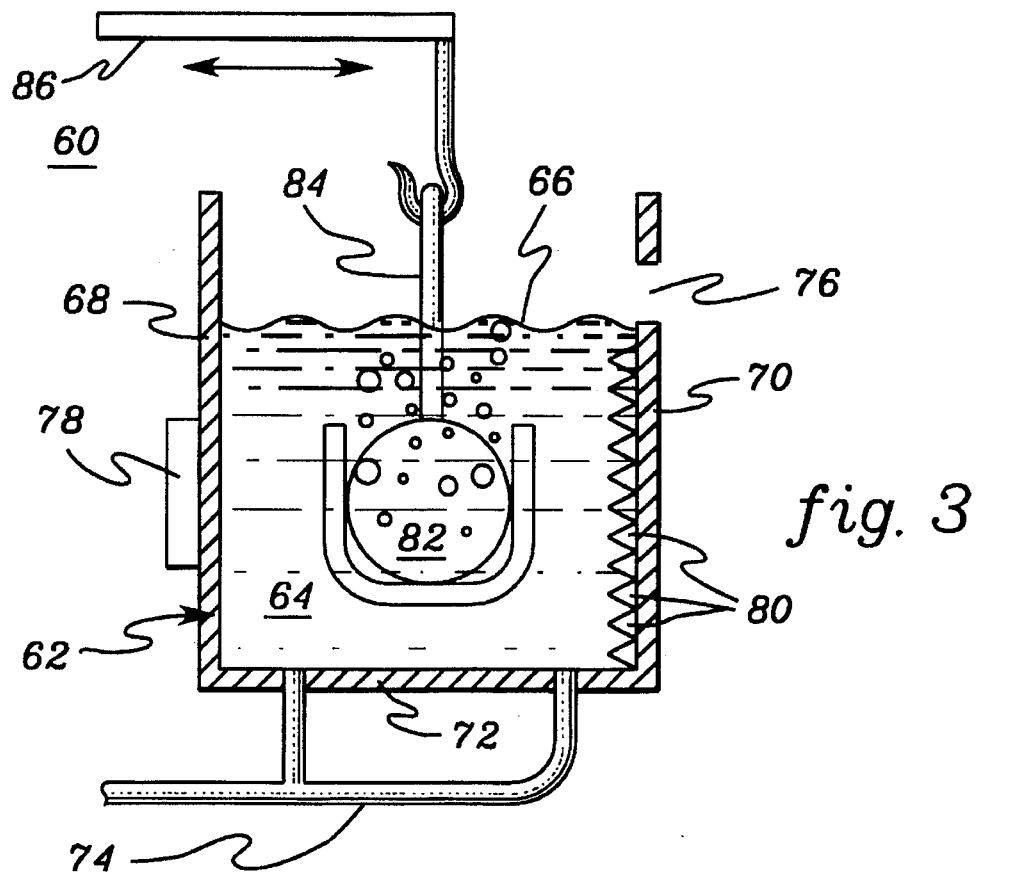
FIG. 3 is an elevational view of another embodiment of a megasonic cleaning/etching apparatus pursuant to the present invention.

In another embodiment of the present invention, depicted in FIG. 3, a megasonic cleaning/etching apparatus 60 includes a recirculation tank 62, which holds a cleaning fluid 64 having an upper surface 66. Tank 62 includes first and second opposing sidewalls 68 & 70, respectively, and a bottom structure 72. Cleaning liquid is introduced into the bottom portion of tank 62 via an appropriate chemical feed line 74. An overflow weir 76 removes excess cleaning fluid from tank 62. First sidewall 68 contains one or more megasonic transducers 78 which project beams of megasonic energy into cleaning tank 62 towards second sidewall 70.

According to this embodiment, a plurality of anechoic structures 80 are disposed along second sidewall 70. By way of example, structures 80 could comprise a series of cone-shaped protrusions on the inner sidewall of the tank opposite to sidewall 68 upon which transducers 78 are mounted. These cone or pyramid-shaped structures are similar to those found in an anechoic chamber. The cone/pyramid shapes serve to focus incoming waves into an area surrounding the structures. In particular, the wave energy is diverted laterally where it is eliminated by destructive interference from other waves impinging upon the anechoic structure, thus inhibiting the creation of standing waves within the recirculation tank. (Note that the anechoic or anit-reflective structures discussed herein need not be conical or pyramid-shaped. For example, they could be irregular, spherical, triangular, etc.) Cleaning can be further enhanced by placing wafer 82 in a holder 84 connected to an oscillating arm 86.

Figures 4A, 4B, 4C:
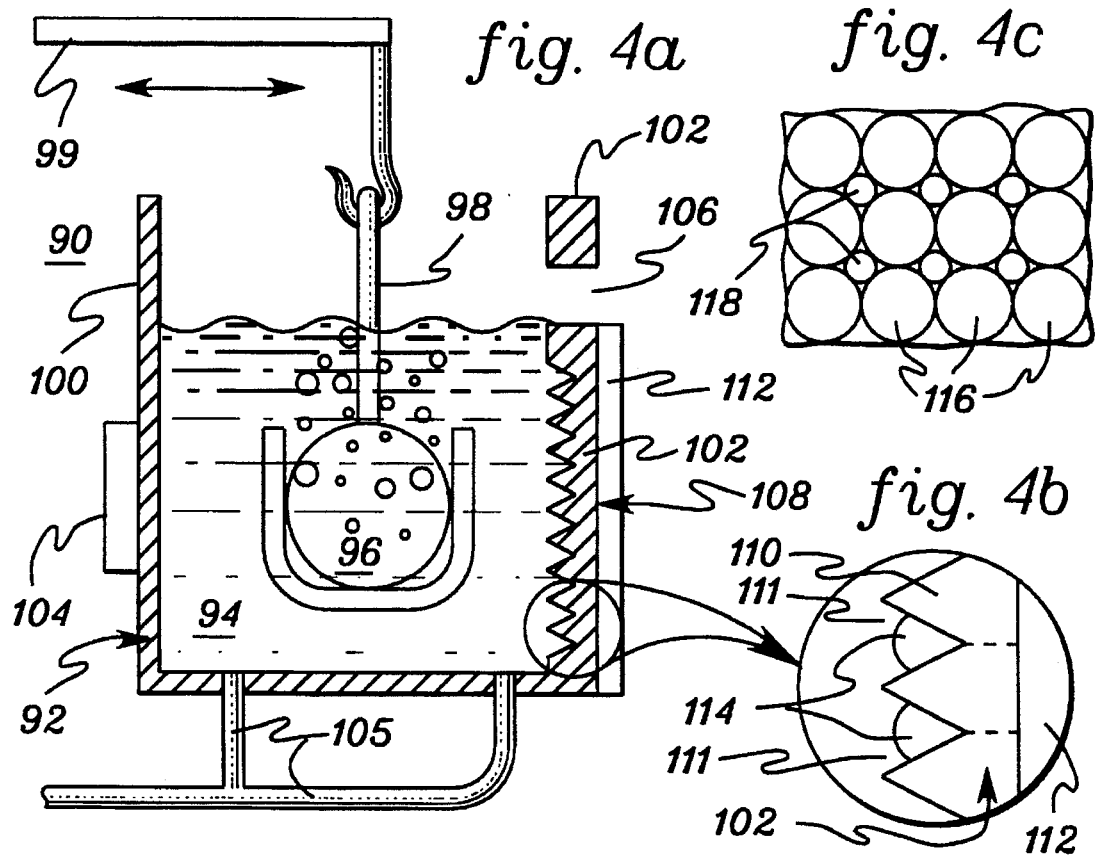

Yet another implementation of the present invention is depicted in FIGS. 4a–4c. As in the other embodiments, megasonic cleaning/etching apparatus 90 includes a recirculation tank 92 containing a cleaning fluid 94 selected to clean (or etch) a surface of one or more semiconductor wafers 96 positioned within a wafer holding device 98. Tank 92 includes two opposing sidewalls 100 and 102, with one or more transducers 104 being positioned on one of the sidewalls. The opposing sidewall contains an overflow weir 106 and, pursuant to the present invention, an anti-reflection mechanism 108. The reflected wave problem is eliminated in this design by having a series of anechoic cones 111 drilled into the wall 102 of the tank opposing the sidewall upon which the transducers are mounted. The cone areas each have a small orifice (shown in phantom in FIG. 4b) at their base which is connected to a gas manifold 112 behind the tank's sidewall. The pressure in the manifold is adjusted to the hydrostatic pressure of the cleaning liquid so that air pockets 114 are formed within each of the recessed areas 111 between the resultant pyramid structures 110 of sidewall surface 102.

This combination of cone recesses and gas pockets results in a wall structure that greatly reduces the amount of reflected wave energy. Incoming waves either bounce off the sides of the cone structures and interfere destructively with each other or hit the gas pockets where they are absorbed. Thus, the recessed cone/gas bubble structure accomplishes the function of eliminating standing waves from the recirculation tank. Depending upon the depth and specific gravity of the fluid, and the choice of materials for the cleaning tank sidewall surfaces, it may be beneficial to have different size cone recesses, such as shown in FIG. 4c, near an upper region of the cleaning tank in comparison with those utilized in a lower region of the tank. In FIG. 4c, small cone areas 118 are interspersed between larger cone recesses 116.

The embodiments depicted have several advantages over conventional megasonic cleaning apparatus implementations. For example, flow patterns are improved because the bottom surface of the tank can be used to form a desired flow pattern rather than being used mostly to accommodate the transducers, as in the bottom mounted implementations. The overall effect of this is to decrease the amount of contamination within the cleaning tank. Additionally, reflected energy is minimized through the elimination of destructive interference of sound waves. This in turn produces a more uniform energy distribution throughout the cleaning tank. Further, by eliminating reflected waves the life span of the tank is improved, thereby eliminating contaminants that would otherwise be introduced into the cleaning fluid through degradation of the tank.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. For example, if desired an anti-reflection mechanism could also (or alternatively) be associated with the bottom structure of the recirculation tank, particularly if the transducers were mounted above the recirculation tank. The following claims are intended to encompass all such modifications.

We claim:

1. A sonic cleaning/etching apparatus comprising:

a recirculation tank for holding a cleaning liquid, said tank having at least one sidewall and a bottom structure;

sonic transducer means associated with said tank for projecting sonic energy into said liquid held within said tank; and anti-reflection means, disposed within said tank in close association with one of said at least one sidewall and said bottom structure, for minimizing reflection of megasonic energy off the associated at least one sidewall or bottom structure, wherein said anti-reflection means inhibits the creation of standing waves within said cleaning liquid held within said tank, said anti-reflection means including means for producing gas bubbles within said cleaning liquid held within said tank along said associated at least one sidewall or bottom structure.

2. The sonic cleaning/etching apparatus of claim 1, wherein said anti-reflection means includes means for injecting a fine stream of gas bubbles into said cleaning liquid held within said tank along said associated at least one sidewall or bottom structure.

3. The sonic cleaning/etching apparatus of claim 1, further comprising a chemical feed line for supplying cleaning liquid to said tank and an overflow weir for removing excess cleaning liquid from said tank.

4. The sonic cleaning/etching apparatus of claim 1, wherein said apparatus is used for cleaning a surface of a semiconductor wafer, and said apparatus further comprises a carrier for holding a plurality of semiconductor wafers for cleaning within said cleaning liquid held within said tank.

5. The sonic cleaning/etching apparatus of claim 4, further comprising means for oscillating said carrier within said tank to facilitate cleaning of said semiconductor wafers held therein.

6. The sonic cleaning/etching apparatus of claim 1, wherein said sonic transducer means projects sonic energy into said cleaning liquid in the megasonic range of 0.2 MHz–5.0 MHz.

7. A megasonic cleaning/etching apparatus comprising:

a recirculation tank for holding a cleaning liquid, said tank having opposing first and second sidewalls;

megasonic transducer means associated with said first sidewall for projecting megasonic energy into said cleaning liquid towards said second sidewall; and anti-reflection means disposed adjacent to said second sidewall for minimizing reflection of megasonic energy from said second sidewall such that the creation of standing waves within said cleaning liquid is inhibited; said anti-reflection means comprising means for introducing gas bubbles into said cleaning liquid only adjacent to said second sidewall.

8. The megasonic cleaning/etching apparatus of claim 1, wherein said apparatus is used for cleaning a surface of a semiconductor wafer and wherein said apparatus further includes a carrier for immersing a plurality of semiconductor wafers for cleaning simultaneously within said cleaning liquid.

9. The megasonic cleaning/etching apparatus of claim 8, wherein said apparatus further includes means for oscillating said carrier to facilitate cleaning of said semiconductor wafers.

10. The megasonic cleaning/etching apparatus of claim 7 wherein said megasonic transducer means includes a plurality of sonic transducers associated with said first sidewall for projecting a substantially even distribution of megasonic energy into said cleaning liquid towards said second sidewall.

11. A megasonic cleaning/etching apparatus comprising:

a recirculation tank for holding a cleaning liquid, said tank having opposing first and second sidewalls;

megasonic transducer means associated with said first sidewall for projecting megasonic energy into said cleaning liquid towards said second sidewall; and anti-reflection means disposed adjacent to said second sidewall for minimizing reflection of megasonic energy from said second sidewall such that the creation of standing waves within said cleaning liquid is inhibited, said anti-reflection means including means for injecting a fine stream of gas bubbles into said cleaning liquid along said second sidewall.

12. The megasonic cleaning/etching apparatus of claim 11, wherein said apparatus is used for cleaning a surface of a semiconductor wafer and wherein said apparatus further includes a carrier for immersing a plurality of semiconductor wafers for cleaning simultaneously within said cleaning liquid.

13. The megasonic cleaning/etching apparatus of claim 12, wherein said apparatus further includes means for oscillating said carrier to facilitate cleaning of said semiconductor wafers.

14. The megasonic cleaning/etching apparatus of claim 11, wherein said megasonic transducer means includes a plurality of sonic transducers associated with said first sidewall for projecting a substantially even distribution of megasonic energy into said cleaning liquid towards said second sidewall.

* * * * *

UNITED STATES PATENT AND TRADEMARK OFFICE
CERTIFICATE OF CORRECTION

PATENT NO.: 5,533,540

DATED: Jul. 9, 1996

INVENTOR(S): Stanasolovich et al.

It is certified that error appears in the above-identified patent and that said Letters Patent is hereby corrected as shown below:

<u>In the Claims</u>:

Column 7, line 35, delete ";" and substitute therefor --,--.

Column 7, line 39, delete "1" and substitute --7--.

Column 8, line 7, after "7" insert --,--.

Signed and Sealed this

Third Day of December, 1996

Attest:

BRUCE LEHMAN

*Attesting Officer*     *Commissioner of Patents and Trademarks*